(12) United States Patent  
Nagahama

(10) Patent No.: US 7,795,688 B2  
(45) Date of Patent: Sep. 14, 2010

(54) SEMICONDUCTOR DEVICE AND METHOD OF MANUFACTURING SEMICONDUCTOR DEVICE

(75) Inventor: Yoshihiko Nagahama, Kanagawa (JP)

(73) Assignee: Sony Corporation, Tokyo (JP)

( * ) Notice: Subject to any disclaimer, the term of this patent is extended or adjusted under 35 U.S.C. 154(b) by 864 days.

(21) Appl. No.: 11/422,975

(22) Filed: Jun. 8, 2006

(65) Prior Publication Data

US 2006/0278934 A1    Dec. 14, 2006

(30) Foreign Application Priority Data

Jun. 13, 2005    (JP)    ............................ P2005-172031

(51) Int. Cl.
*H01L 29/43*    (2006.01)
(52) U.S. Cl. ................ 257/369; 257/407; 257/E27.064
(58) Field of Classification Search ................. 257/407, 257/369, E27.064
See application file for complete search history.

(56) References Cited

U.S. PATENT DOCUMENTS

| | | | |
|---|---|---|---|
| 6,790,719 B1 * | 9/2004 | Adetutu et al. ............... | 438/195 |
| 6,881,631 B2 * | 4/2005 | Saito et al. ................... | 438/283 |
| 6,887,747 B2 * | 5/2005 | Yagishita et al. ............. | 438/197 |
| 7,439,113 B2 * | 10/2008 | Doczy et al. ................. | 438/157 |
| 7,485,936 B2 * | 2/2009 | Koyama et al. .............. | 257/407 |
| 7,528,024 B2 * | 5/2009 | Colombo et al. ............. | 438/176 |

FOREIGN PATENT DOCUMENTS

| | | |
|---|---|---|
| JP | 2003-045995 | 2/2003 |
| JP | 2003-258121 | 9/2003 |

* cited by examiner

*Primary Examiner*—W. David Coleman
*Assistant Examiner*—Sun M Kim
(74) *Attorney, Agent, or Firm*—Sonnenschein Nath & Rosenthal LLP

(57) ABSTRACT

A semiconductor device including, on a substrate, a first conduction type MOS transistor having a gate electrode provided in a first trench formed in an insulation film on the substrate, and a second conduction type MOS transistor having a gate electrode provided in a second trench formed in the insulation film, the first conduction type and the second conduction type being opposite types.

2 Claims, 9 Drawing Sheets

SEMICONDUCTOR DEVICE AND METHOD OF MANUFACTURING SEMICONDUCTOR DEVICE

CROSS REFERENCES TO RELATED APPLICATIONS

The present invention contains subject matter related to Japanese Patent Application JP 2005-172031 filed in the Japanese Patent Office on Jun. 13, 2005, the entire contents of which being incorporated herein by reference.

BACKGROUND OF THE INVENTION

1. Field of the Invention

The present invention relates to a semiconductor device and a method of manufacturing the same by which it is possible to prevent galvanic corrosion from occurring in a dual metal gate structure.

2. Description of the Related Art

Transistors with a higher degree of integration and a higher operating speed have been realized by miniaturization of the transistors, based on the scaling rule. Thinning of the gate insulation film has progressed, and in a transistor of a gate length of, for example, 0.1 µm or less, it may be necessary to reduce the thickness of the gate insulation film to or below 2 nm.

As a gate electrode material, normally, polycrystalline Si (polysilicon) is used. The reasons for this include the stability of the interface between the gate electrode and the gate insulation film beneath the gate electrode. Another reason lies in that, since an impurity can be easily introduced into the inside of polysilicon by such techniques as ion implantation and diffusion, it is possible to obtain an optimum threshold by forming gate electrodes with optimum work functions for nMOS and pMOS through appropriately selecting the impurity element and the concentration thereof.

However, attendant on the miniaturization of transistors, the problem of depletion of the gate electrode has become conspicuous. The depletion of the gate electrode is a phenomenon which is difficult to restrain, because polysilicon is a semiconductor. In view of this, it has been widely reported that the depletion of the gate electrode can be restrained by forming a film of a metal, in place of polysilicon, directly on the gate insulation film, and attention has therefore been paid to the development of a metal gate.

However, in the case where the metal gate is composed of a single kind of metal, the work function of the gate electrode for an nMOS transistor and that for a pMOS transistor are equal to each other. Therefore, it is difficult to regulate the work function of the gate electrode for the nMOS transistor and the work function of the gate electrode for the pMOS transistor, and it may be impossible to obtain a proper threshold value.

In order to overcome this problem, a dual metal gate has been proposed in which metallic materials are selected individually for the gate electrode of the nMOS transistor and the gate electrode of the pMOS transistor; for example, a metallic material having a work function comparable to that of n-type polysilicon is adopted for the gate electrode of the nMOS transistor and a metallic material having a work function comparable to that of p-type polysilicon is adopted for the gate electrode of the pMOS transistor (refer to, for example, Japanese Patent Laid-open Nos. 2003-258121 and 2003-45995).

Now, a method of producing a transistor with a dual metal gate electrode according to the related art will be described below, referring to manufacturing step sectional diagrams shown in FIGS. 6A to 6I.

First, as shown in FIG. 6A, trenches 112 and 113 for forming metal gates are formed in a layer insulation film 111 formed on a substrate, by a lithography technique and a dry etching technique. The layer insulation film 111 is composed, for example, of a silicon oxide film.

Next, as shown in FIG. 6B, a gate insulation film 121 and a metal gate material layer 122 for a pMOS transistor are formed on the whole surface of the layer insulation film 111 inclusive of the inside surfaces of the trenches 112, 113. The gate insulation film 121 in a thickness of, for example, several micrometers, and the metal gate material layer 122 is formed of a pMOS metal gate material in a thickness of about 10 to 40 nm. Incidentally, the substrate 11 portion is omitted in FIGS. 6B to 6I.

Subsequently, as shown in FIG. 6C, a resist is applied to the whole upper surface of the metal gate material layer 122 (the whole upper surface of the substrate), to form a resist film 123.

Next, as shown in FIG. 6D, an opening portion 124 is formed in the resist film 123 on the upper side of an nMOS transistor forming region, by a lithography technique. In this case, the resist film 122 is left on the upper side of a pMOS transistor forming region.

Subsequently, as shown in FIG. 6E, with the resist film 123 as an etching mask, the metal gate material layer 122 for the pMOS transistor in the nMOS transistor forming region is selectively etched by use of a chemical liquid. As a result, the metal gate material layer 122 for the pMOS transistor is left in the pMOS transistor forming region.

Next, the resist film 123 is removed by use of an organic solvent. As a result, the metal gate material layer 122 for the pMOS transistor is exposed, as shown in FIG. 6F.

Subsequently, as shown in FIG. 6G, a metal gate material layer 125 for the nMOS transistor is formed to cover the metal gate material layer 122 and to cover the whole surface of the layer insulation film 111 inclusive of the inside surfaces of the trenches 112, 113. The metal gate material layer 125 is formed of an nMOS metal gate material in a thickness of 10 to 40 nm, for example.

Next, as shown in FIG. 6H, an electrode metallic material layer 126 is formed on the metal gate material layer 125 for the nMOS transistor inclusive of the inside surfaces of the trenches 112, 113.

Subsequently, as shown in FIG. 6I, surplus portions of the electrode metallic material layer 126, the metal gate material layer 125 for the nMOS transistor and the metal gate material layer 122 for the pMOS transistor on the layer insulation film 111 are removed by chemical mechanical polishing (hereinafter abridged as CMP), whereby a metal gate 131 having the metal gate material layers 122, 125 and the electrode metallic material layer 126 embedded in the trench 112 with the gate insulation film 121 therebetween is formed, and a metal gate 132 having the metal gate material layer 125 for the pMOS transistor and the electrode metallic material layer 126 embedded in the trench 113 with the gate insulation film 121 therebetween is formed. In this manner, a dual gate structure including the metal gates is formed.

SUMMARY OF THE INVENTION

For polishing (CMP) of four kinds of materials constituting the electrode metallic material layer, the metal gate material for the nMOS transistor, the metal gate material layer for the pMOS transistor and the gate insulation film, it may be necessary to regulate the selection ratios among the total of five kinds of materials including the four kinds of materials to be polished and an under film (e.g., silicon oxide ($SiO_2$)), and it is highly difficult to develop abrasives (slurries). In addition, since a plurality of films are polished, it is difficult to stabilize the scatterings of processing, due to the presence of scattering of thicknesses of the films and scattering of polishing rate differences among the films. Further, since a maximum of three metallic material layers laminated are exposed at the time of CMP, galvanic corrosion is liable to be generated due to the potential differences between different metals, which may lower the yield and reliability.

Thus, there is a need to reduce the number of metallic layers exposed at the time of polishing an electrode metallic material layer, and to enable polishing with high processing accuracy while permitting polishing with abrasives used in the related art and preventing galvanic corrosion from occurring at the time of polishing.

In order to fulfill the above need, according to an embodiment of the present invention, there is provided a semiconductor device including, on a substrate, a first conduction type MOS transistor having a gate electrode provided in a first trench formed in an insulation film on the substrate, and a second conduction type MOS transistor having a gate electrode provided in a second trench formed in the insulation film, the first conduction type and the second conduction type being opposite types. In the semiconductor device, a first gate electrode material layer of the first conduction type MOS transistor, a second electrode material layer of the second conduction type MOS transistor, and an electrode metal layer are formed in the first trench, with a gate insulation film therebetween, the first gate electrode material layer and the second gate electrode material layer are covered by the electrode metal layer in the first trench; and a second gate electrode material layer of the second conduction type MOS transistor, and an electrode metal layer are formed in the second trench, with a gate insulation film therebetween, and the second gate electrode material layer is covered by the electrode metal layer in the second trench.

In this semiconductor device, the first gate electrode material layer and the second gate electrode material layer are covered by the electrode metal layer in the first trench in which the gate of the first conduction type MOS transistor is formed, and the second gate electrode material layer is covered by the electrode metal layer in the second trench in which the gate of the second conduction type MOS transistor is formed. Therefore, when polishing is so conducted as to leave the electrode metal layer in the first trench and the second trench, the layers exposed to the surface are the electrode metal layer and the gate insulation film, so that galvanic corrosion would not easily be generated. In addition, since the electrode metal layer can be formed inside the first trench and the second trench by polishing only the electrode metal layer, polishing with high accuracy can be easily achieved while using an abrasive used in the related art.

According to another embodiment of the present invention, there is provided a semiconductor device including, on a substrate, a first conduction type MOS transistor having a gate electrode provided in a first trench formed in an insulation film on the substrate, and a second conduction type MOS transistor having a gate electrode provided in a second trench formed in the insulation film, the first conduction type and the second conduction type being opposite types. In the semiconductor device, a first gate electrode material layer of the first conduction type MOS transistor, a second gate electrode material layer of the second conduction type MOS transistor, and an electrode metal layer are formed in the first trench, with a gate insulation film therebetween, at least the first gate electrode material layer is covered by the second gate electrode material layer in the first trench; and a second gate electrode material layer of the second conduction type MOS transistor, and an electrode metal layer are formed in the second trench, with a gate insulation film therebetween, and the second gate electrode material layer is covered by the electrode metal layer in the second trench.

In this semiconductor device, the first gate electrode material layer is covered by the second gate electrode material layer in the first trench in which the gate of the first conduction type MOS transistor is formed. Therefore, when polishing is so conducted as to leave the electrode metal layer in the first trench and the second trench, the layers exposed at the surface are the electrode metal layer, the second gate electrode material layer and the gate insulation film, so that the number of layers exposed at the time of polishing is reduced, as compared with the number of kinds of metallic layers exposed at the time of polishing in the related art. As a result, galvanic corrosion is generated with difficulty. Besides, since the electrode metal layer can be formed inside the first trench and the second trench by polishing of the electrode metal layer and the second gate electrode material layer, polishing with high accuracy can be easily achieved while using an abrasive used in the related art.

According to a further embodiment of the present invention, there is provided a method of manufacturing a semiconductor device including, on a substrate, a first conduction type MOS transistor having a gate electrode provided in a first trench formed in an insulation film on the substrate, and a second conduction type MOS transistor having a gate electrode in a second trench formed in the insulation film, the first conduction type and the second conduction type being opposite types. The method includes the steps of: forming a gate insulation film in the first trench and in the second trench; forming a first gate electrode material layer of the first conduction type MOS transistor in the first trench, with the gate insulation film therebetween and in the range from an opening portion to the interior side of the first trench; forming a second gate electrode material layer in the first trench, with the gate insulation film and the first gate electrode material layer therebetween, and in the second trench, with the gate insulation film therebetween; removing the second gate electrode material layer so that the second gate electrode material layer is present only on the interior side relative to the opening portion in each of the first trench and the second trench; forming an electrode metal layer in the first trench and the second trench so as to fill the trenches, thereby covering the first gate electrode material layer and the second gate electrode material layer in the first trench with the electrode metal layer and covering the second gate electrode material layer in the second trench with the electrode metal layer; and removing surplus portions of the electrode metal layers on the insulation films so as to leave the electrode metal layer in the state of covering the first gate electrode material layer and the second gate electrode material layer in the first trench, and to leave the electrode metal layer in the state of covering the second gate electrode material layer in the second trench, thereby forming a gate electrode of the first conduction type MOS transistor in the first trench and forming a gate electrode of the second conduction type MOS transistor in the second trench.

In this method of manufacturing a semiconductor device, the first gate electrode material layer and the second gate electrode material layer are covered by the electrode metal layer in the first trench in which the gate of the first conduction type MOS transistor is formed, and the second gate electrode metal layer is covered by the electrode metal layer in the second trench in which the gate of the second conduction type MOS transistor is formed; therefore, when polishing is so conducted as to leave the electrode metal layer in the first trench and the second trench, the layers exposed to the surface are the electrode metal layer and the gate insulation film. As a result, galvanic corrosion is generated with difficulty. Besides, since the electrode metal layer can be formed inside the first trench and the second trench by polishing only the electrode metal layer, polishing with high accuracy can be easily realized while using an abrasive used in the related art.

According to yet another embodiment of the present invention, there is provided a method of manufacturing a semiconductor device including, on a substrate, a first conduction type MOS transistor having a gate electrode provided in a first trench formed in an insulation film on the substrate, and a second conduction type MOS transistor having a gate electrode provided in a second trench formed in the insulation film, the first conduction type and the second conduction type being opposite types. The method includes the steps of: forming a gate insulation film in the first trench and in the second trench; forming a first gate electrode material layer of the first conduction type MOS transistor in the first trench, with the gate insulation film therebetween and in the range from an opening portion to the interior side of the first trench; forming a second gate electrode material layer in the first trench, with the gate insulation film and the first gate electrode material layer therebetween, and in the second trench, with the gate insulation film therebetween; forming an electrode metal layer so as to fill up the first trench and the second trench; and removing surplus portions of the electrode metal layers and the second gate electrode material layers on the insulation films so as to form the gate electrode of the first conduction type MOS transistor included the first gate electrode material layer, the second gate electrode material layer and the electrode metal layer in the first trench and to form the gate electrode of the second conduction type MOS transistor included the second gate electrode material layer and the electrode metal layer in the second trench.

In this method of manufacturing a semiconductor device, the first gate electrode material layer is covered by the second gate electrode material layer in the first trench in which the gate of the first conduction type MOS transistor is formed; therefore, when polishing is so conducted as to leave the electrode metal layer in the first trench and the second trench, the layers exposed to the surface are the electrode metal layer, the second gate electrode material layer and the gate insulation film. Therefore, since the number of layers exposed is reduced, as compared with the number of kinds of metallic layers exposed at the time of polishing in the related art, so that galvanic corrosion is generated with difficulty. In addition, since the electrode metal layer can be formed inside the first trench and the second trench by polishing the electrode metal layer and the second gate electrode material layer, polishing with high accuracy can be easily carried out while using an abrasive used in the related art.

The semiconductor device in the present invention is so configured that polishing can be performed while suppressing or preventing galvanic corrosion, so that a gate structure with high reliability can be obtained, and transistor performance can be enhanced.

The method of manufacturing a semiconductor device in the present invention is so configured that polishing can be performed while suppressing or preventing galvanic corrosion, so that a gate structure with high reliability can be obtained, yield can be enhanced, and transistor performance can be enhanced. In addition, by selecting the second gate electrode material layer and the electrode metal layer so as to reduce the potential difference between the metallic layers exposed at the time of polishing, it is possible to securely suppress or prevent galvanic corrosion.

DETAILED DESCRIPTION OF THE PREFERRED EMBODIMENTS

Now, a first example of an embodiment of the semiconductor device in the present invention will be described below, referring to a schematic configuration sectional diagram shown in FIG. 1.

Figure 1:
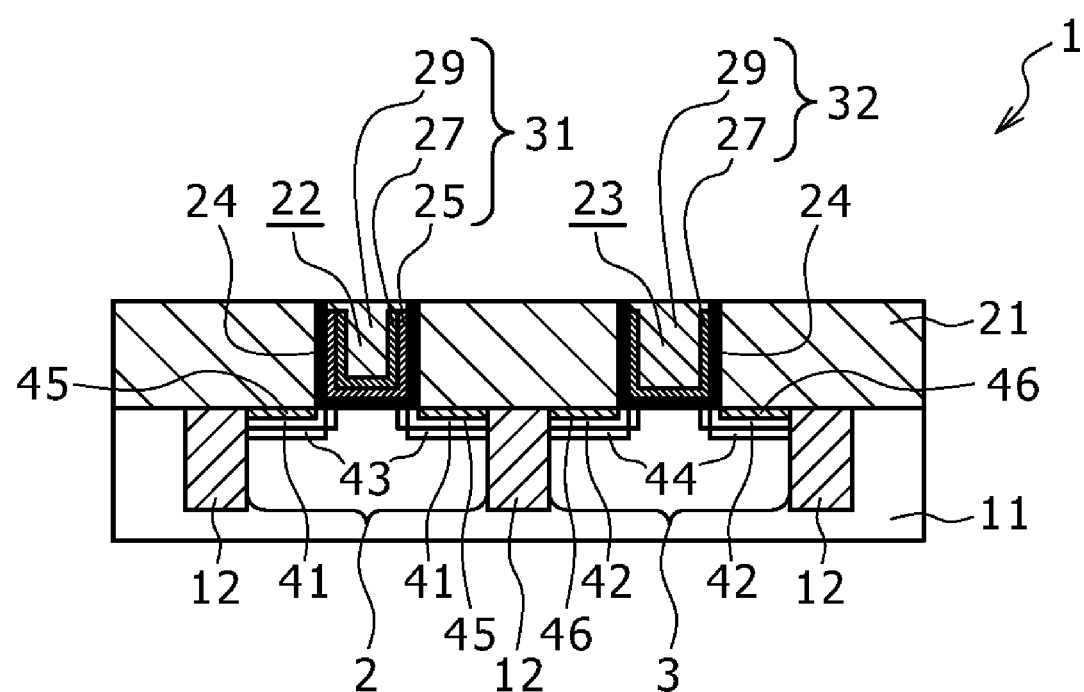
FIG. 1 is a schematic configuration sectional diagram showing a first example of an embodiment of the semiconductor device in the present invention.

As shown in FIG. 1, a first conduction type (p-type) MOS transistor 2 and a second conduction type (n-type) MOS transistor 3 of the type opposite to the first conduction type are formed in a substrate 11 in the state of being isolated by a device isolation region 12, to constitute a semiconductor device 1. An insulation film 21 formed on the substrate 11 is provided with a first trench 22, and a gate electrode 31 of the p-type MOS transistor 2 is formed in the first trench 22. In addition, the insulation film 21 is provided with a second trench 23, and a gate electrode 32 of the n-type MOS transistor 3 is formed in the second trench 23.

A first gate electrode material layer 25 of the first conduction type MOS transistor, a second gate electrode material layer 27 of the second conduction type MOS transistor, and an electrode metal layer 29 are formed in the first trench 22, with a gate insulation film 24 therebetween, to constitute the gate electrode 31. The first gate electrode material layer 25 and the second gate electrode material layer 27 are covered by the electrode metal layer 29 in the first trench 22.

The second gate electrode material layer 27 of the second conduction type MOS transistor and the electrode metal layer 29 are formed in the second trench 23, with the gate insulation film 24 therebetween, to constitute the gate electrode 32. The second gate electrode material layer 27 is covered by the electrode metal layer 29 in the second trench 23.

The first gate electrode material layer 25 can be formed, for example, of a tantalum (Ta), hafnium (Hf), titanium (Ti), tungsten (W), ruthenium (Ru) or an alloy of a plurality of metals selected from these metals. The second gate electrode material layer 27 is formed of a metallic material used as a gate electrode material in an n-type MOS transistor, for example, titanium (Ti), hafnium (Hf), tantalum (Ta), tungsten (W), ruthenium (Ru) or an alloy thereof. The electrode metal layer 29 can be formed, for example, of tungsten (W), tantalum (Ta), titanium (Ti), or an alloy thereof, or a laminate film composed of two or more metals selected from these metals.

The substrate 11 is provided with extension regions 41 on both sides of the gate electrode 31 in the p-type MOS transistor region. In addition, the substrate 11 is provided with extension regions 42 on both sides of the gate electrode 32 in the n-type MOS transistor region. Further, the substrate 11 is provided with source/drain regions 43 deeper than the extension regions 41, on both sides of the gate electrode 31 in the p-type MOS transistor region. Besides, the extension regions 41 are so formed as to extend to the gate electrode 31 side, relative to the source/drain regions 43. Further, the substrate 11 is provided with source/drain regions 44 deeper than the extension regions 42, on both sides of the gate electrode 32 in the n-type MOS transistor. In addition, the extension regions 42 are so formed as to extend to the gate electrode 32 side, relative to the source/drain regions 44. Silicide films 45 and 46 are formed on the surfaces of the source/drain regions 43 and 44, to lower the resistances of the source/drain regions 43 and 44. The silicide films 45 and 46 are each composed of cobalt silicide, for example.

In the semiconductor device 1, the first gate electrode material layer 25 and the second gate electrode material layer 27 are covered by the electrode metal layer 29 in the first trench 22 in which the gate electrode 31 of the p-type MOS transistor 2 is formed, and the second gate electrode material layer 27 is covered by the electrode metal layer 29 in the second trench 23 in which the gate electrode 32 of the n-type MOS transistor 3 is formed. Therefore, when polishing is conducted so as to leave the electrode metal layer 29 in the first trench 22 and the second trench 23, the layers exposed to the surface are the electrode metal layer 29 and the gate insulation film 24, so that galvanic corrosion is generated with difficulty in this structure. In addition, since the electrode metal layer 29 can be formed inside the first trench 22 and the second trench 23 by polishing only the electrode metal layer 29, polishing with high accuracy can be easily achieved while using an abrasive used in the related art.

Accordingly, since the semiconductor device 1 in an embodiment of the present invention is so configured that polishing can be performed while suppressing or preventing galvanic corrosion, a gate structure with high reliability can be obtained, and transistor performance can be enhanced.

Now, an example of an embodiment of the method of manufacturing a semiconductor device in the present invention will be described below, referring to manufacturing step sectional diagrams shown in FIGS. 2A to 2K. Incidentally, the device isolation regions, the source/drain regions of the MOS transistors, the extension regions and the like formed in the substrate 11 are omitted in these figures. Details thereof will be described later referring to FIGS. 3A to 3H.

Figure 2A:
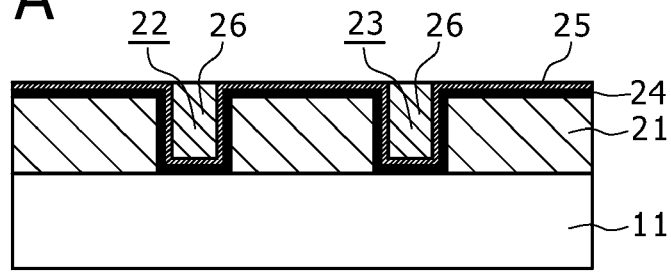
FIGS. 2A to 2K are manufacturing step sectional diagrams showing a first example of an embodiment of the method of manufacturing a semiconductor device in the present invention.

As shown in FIG. 2A, an insulation film 21 formed on a substrate 11 is provided with a first trench 22 in which to form a gate electrode of a first conduction type (hereinafter described to be p-type) MOS transistor, and is provided with a second trench 23 in which to form a gate electrode of a second conduction type (hereinafter described to be n-type) MOS transistor. The first trench 22 and the second trench 23 are formed by ordinary lithography technique and etching technique (e.g., dry etching). Besides, the insulation film 21 is composed, for example, of a silicon oxide film. Incidentally, the formation of the first trench 22, the second trench 23 as well as extension regions and source/drain regions of transistors formed in the substrate 11 will be described later referring to FIGS. 3A to 3H.

Next, a gate insulation film 24 is formed on the insulation film 21 inclusive of the inside surfaces of the first trench 22 and the inside surfaces of the second trench 23. The gate insulation film 24 may be formed, for example, of silicon oxide ($SiO_2$), silicon oxynitride (SiON), nitrogen-containing hafnium silicate (HfSiON), hafnium oxide ($HfO_2$), aluminum oxide ($Al_2O_3$) or the like; here, the gate insulation film was composed, for example, of a silicon oxynitride film having a thickness of 2 nm, for example.

Further, a first gate electrode material layer 25 of the first conduction type MOS transistor is formed on the surface of the gate insulation film 24. The first electrode material layer 25 may be formed, for example, of tantalum (Ta), hafnium (Hf), titanium (Ti), tungsten (W), ruthenium (Ru) or an alloy of a plurality of metals selected from these metals. Here, as an example, the first gate electrode material layer 25 was formed of ruthenium (Ru), and the thickness thereof was set to be 10 to 40 nm.

Thereafter, a mask layer 26 is formed only in the inside of the first trench 22 and the second trench 23. The mask layer 26 can be formed, for example, by a method in which a resist film is formed on the whole surface so as to fill up the first trench 22 and the second trench 23, and surplus portions of the resist film on the insulation film 21 is removed by a processing such as polishing (e.g., CMP) or etch-back.

Figure 2B:
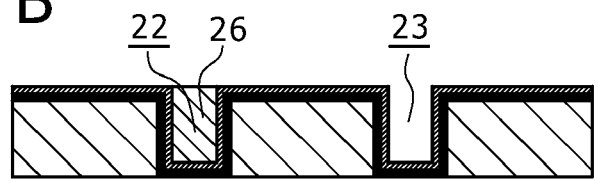

Next, as shown in FIG. 2B, the mask layer 26 formed inside the second trench 23 in which to form the gate of an n-type MOS transistor is removed while leaving the mask layer 26 inside the first trench 22 in which to form the gate of a p-type MOS transistor. Incidentally, the substrate 11 portion is omitted in FIGS. 2B to 2J.

Figure 2C:
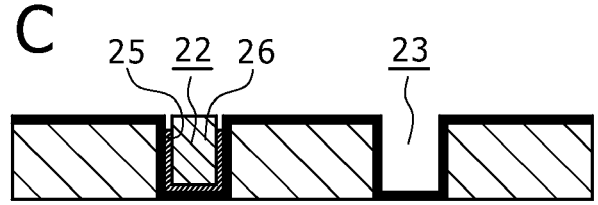

Subsequently, as shown in FIG. 2C, by use of the mask layer 26 as an etching mask, the first gate electrode material layer 25 is selectively etched by a chemical liquid (e.g., hydrofluoric acid). As a result, that portion of the first gate electrode material layer 25 which is covered with the mask layer 26 inside the first trench 22 is left. In this case, the etching is to be so performed that the first gate electrode material layer 25 thus left is present on the interior side of the first trench 22 relative to an opening portion of the first trench 22.

Figure 2D:
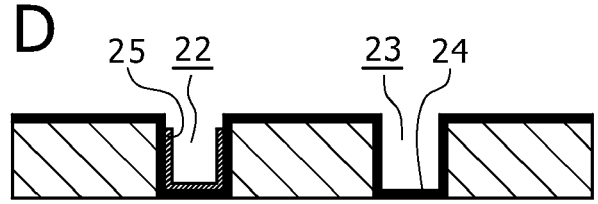

Next, as shown in FIG. 2D, the mask layer 26 [see FIG. 2C] is removed. The removal may be conducted by use of an organic solvent. As a result, in the first trench 22, the first gate electrode material layer 25 is formed on the interior side of the first trench 22 relative to the opening portion of the first trench 22, and the gate insulation film 24 is exposed inside the second trench 23.

Figure 2E:
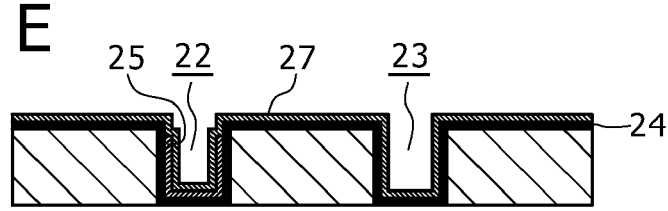

Subsequently, as shown in FIG. 2E, a second gate electrode material layer 27 is formed in the first trench 22, with the gate insulation film 24 and the first gate electrode material layer 25 therebetween, and in the second trench 23, with the gate insulation film 24 therebetween. The second gate electrode material layer 27 is formed of a metallic material used as a gate electrode material for an n-type MOS transistor, for example, titanium (Ti), hafnium (Hf), tantalum (Ta), tungsten (W), ruthenium (Ru) or an alloy of such metals. Here, the second gate electrode material layer 27 was formed of hafnium in a thickness of 10 to 40 mm, for example.

Figure 2F:
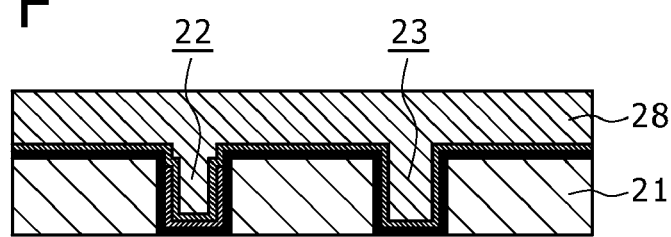

Next, as shown in FIG. 2F, a mask layer 28 is formed so as to fill up the inside of the first trench 22 and the second trench 23 by, for example, forming a resist mask on the whole surface.

Figure 2G:
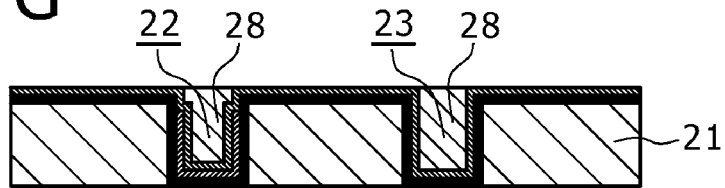

Thereafter, as shown in FIG. 2G, by a processing such as polishing (e.g., CMP) and etch-back, the surplus mask layer 28 on the insulation film 21 is removed, leaving the mask layer 28 only inside the first trench 22 and the second trench 23.

Figure 2H:
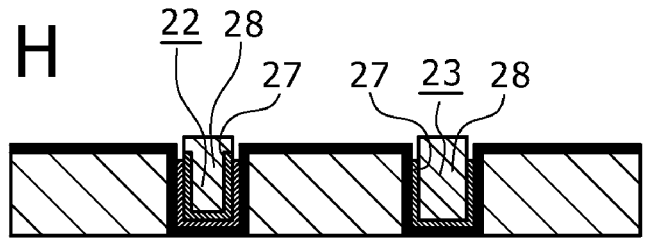

Subsequently, as shown in FIG. 2H, by use of the mask layer 28 as an etching mask, the second gate electrode material layer 27 is selectively etched by a chemical liquid (e.g., hydrofluoric acid). As a result, that portion of the second gate electrode material layer 27 which is covered by the mask layer 28 inside the first trench 22 and that portion of the second gate electrode material 27 which is covered by the mask layer 28 inside the second trench 23 are left. In this case, it may be necessary to perform the etching so that the second gate electrode material layer 27 thus left is present on the interior side of the first trench 22 and the second trench 23 relative to the opening portions of the first trench 22 and the second trench 23.

Figure 2I:
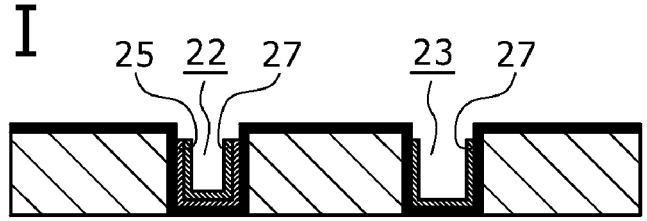

Next, as shown in FIG. 2I, the mask layer 28 [see FIG. 2H] is removed. The removal may be conducted by use of an organic solvent. As a result, in the first trench 22, the first gate electrode material layer 25 and the second gate electrode material layer 27 are formed on the interior side of the first trench 22 relative to the opening portion of the first trench 22, and, in the second trench 23, the second gate electrode material layer 27 is formed on the interior side of the second trench 23 relative to the opening portion of the second trench 23.

Figure 2J:
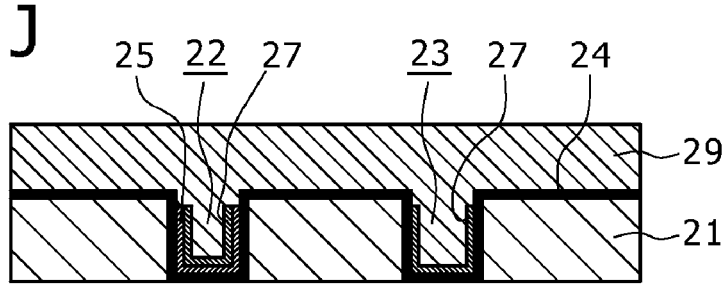

Subsequently, as shown in FIG. 2J, an electrode metal layer 29 is formed on the insulation film 21, with the gate insulation film 24 therebetween, so as to fill up the inside of the first trench 22 and the second trench 23. The electrode metal layer 29 may be formed, for example, of tungsten (W), tantalum (Ta), titanium (Ti), or an alloy of these metals, or a laminate film of two or more metals selected from these metals. Here, as one example, tungsten (W) was used. As a result, in the first trench 22, the first gate electrode material layer 25 and the second gate electrode material layer 27 are covered with the electrode metal layer 29, and, in the second trench 23, the second gate electrode material layer 27 is covered with the electrode metal layer 29.

Figure 2K:
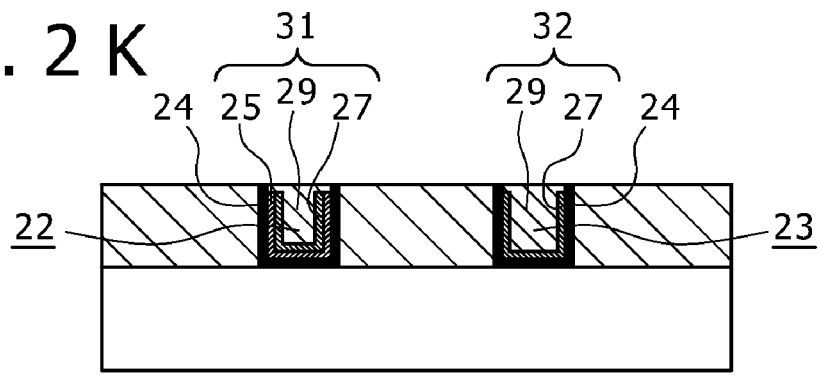

Next, as shown in FIG. 2K, the electrode metal layer 29 is polished away by a polishing technique (e.g., CMP), leaving the electrode metal layer 29 only inside the first trench 22 and the second trench 23. In this manner, a gate electrode 31 of a p-type MOS transistor including the first gate electrode material layer 25, the second gate electrode material layer 27 and the electrode metal layer 29 is formed inside the first trench 22, with the gate insulation film 24 therebetween, and a gate electrode 32 of an n-type MOS transistor including the second electrode material layer 27 and the electrode metal layer 29 is formed inside the second trench 23, with the gate insulation film 24 therebetween.

In the above-described method, the etching of the first gate electrode material layer 25 and the second gate electrode material layer 27 by use of the mask layers 26 and 28 as etching masks can be conducted by using hydrofluoric acid, a compound thereof or a fluorine-containing compound as an etching chemical liquid. In addition, dry etching may be conducted in place of the etching using a chemical liquid. In this case, a fluoro etching gas can be used.

In addition, the processing of the electrode metal layer 29 may be conducted by whole surface etch-back based on dry etching, in place of the CMP. In this case, a fluoro etching gas may be used.

In the above method of manufacturing a semiconductor, the first gate electrode material layer 25 and the second gate electrode material layer 27 are covered by the electrode metal layer 29 in the first trench 22 in which to form the gate of the first conduction type (p-type) MOS transistor, and the second gate electrode material layer 27 is covered by the electrode metal layer 29 in the second trench 23 in which to form the gate of the second conduction type MOS transistor. Therefore, when the polishing is so conducted as to leave the electrode metal layer 29 in the first trench 22 and the second trench 23, the layers exposed to the surface are the electrode metal layer 29 and the gate insulation film 24. Accordingly, galvanic corrosion is generated with difficulty. In addition, since the electrode metal layer 29 can be formed inside the first trench 22 and inside the second trench 23 by polishing only the electrode metal layer 29, polishing with high accuracy can be easily realized by use of an abrasive used in the related art.

Thus, polishing can be performed while suppressing or preventing the galvanic corrosion, and a gate structure with high reliability can be obtained. Therefore, the yield can be enhanced, and transistor performance can be enhanced.

Now, an example of a method of forming the first trench 22 and the second trench 23 as well as source/drain regions of the p-type MOS transistor, source/drain regions of the n-type MOS transistor, etc. will be described below referring to manufacturing step sectional diagrams shown in FIGS. 3A to 3H.

Figure 3A:
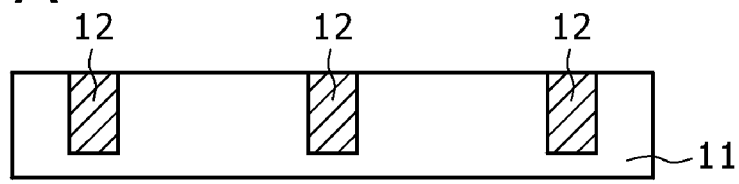
FIGS. 3A to 3H are manufacturing step sectional diagrams showing an example of a method of forming a first trench, a second trench, source/drain regions of a p-type MOS transistor, source/drain regions of an n-type MOS transistor, etc.

As shown in FIG. 3A, device isolation regions 12 for isolating a pMOS transistor forming region and an nMOS transistor forming region from each other are formed in a surface region of a substrate 11 by use of a device isolation forming technique, for example, the STI (Shallow Trench Isolation) technique.

Figure 3B:
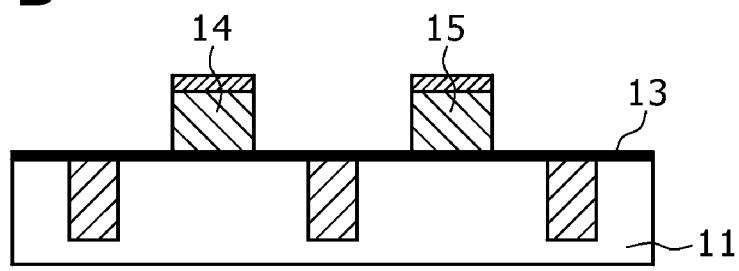

Next, as shown in FIG. 3B, a gate insulation film 13 is formed on the surface of the substrate 11. As the gate insulation film 13, for example, a silicon oxide film may be formed in a thickness of 5 nm by use of a surface oxidation technique. Subsequently, for example, a polysilicon film for forming dummy gates is formed on the gate insulation film 13, and a silicon nitride film is further formed. The polysilicon film is formed in a thickness of 100 nm, and the silicon nitride film is formed in a thickness of 50 nm. Thereafter, by use of ordinary lithography technique and RIE technique, the silicon nitride film and the polysilicon film are patterned, to form dummy gates 14 and 15.

Figure 3C:
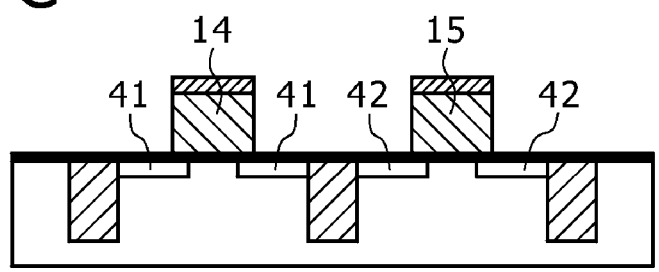

Subsequently, as shown in FIG. 3C, for example, the p-type MOS transistor region is masked, for example, with a resist, and extension regions 42 are formed in the substrate 11 on both sides of the dummy gate 15 in the n-type MOS transistor region by use of an ion implantation technique. Thereafter, the mask is removed, then the n-type MOS transistor region is masked, for example, with a resist, and extension regions 41 are formed in the substrate 11 on both sides of the dummy gate 14 in the p-type MOS transistor region by an ion implantation technique. Thereafter, the mask is removed. The extension regions 41 and the extension regions 42 may be formed in any order.

Figure 3D:
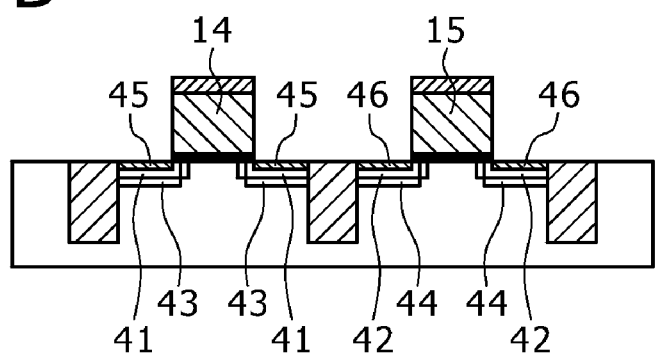

Next, as shown in FIG. 3D, for example, the p-type MOS transistor region is masked, for example, with a resist, and source/drain regions 44 deeper than the extension regions 42 are formed in the substrate 11 on both sides of the dummy gate 15 in the n-type MOS transistor region by use of an ion implantation technique. In addition, the source/drain regions 44 are so formed that the extension regions 42 extend to the dummy gate 15 side, relative to the source/drain regions 44. Thereafter, the mask is removed, then the n-type MOS transistor region is masked, for example, with a resist, and source/drain regions 43 deeper than the extension regions 41 are formed in the substrate 11 on both sides of the dummy gate 14 in the p-type MOS transistor region by use of an ion implantation technique. Besides, the source/drain regions 43 are so formed that the extension regions 41 extend to the dummy gate 14 side, relative to the source/drain regions 43. Thereafter, the mask is removed. The source drain regions 43 and the source/drain regions 44 may be formed in any order.

Subsequently, silicide films 45 and 46 are formed on the surfaces of the source/drain regions 43 and 44. The silicide films 45, 46 can be formed by an ordinary silicide process. Here, as an example, they are formed of cobalt silicide.

Figure 3E:
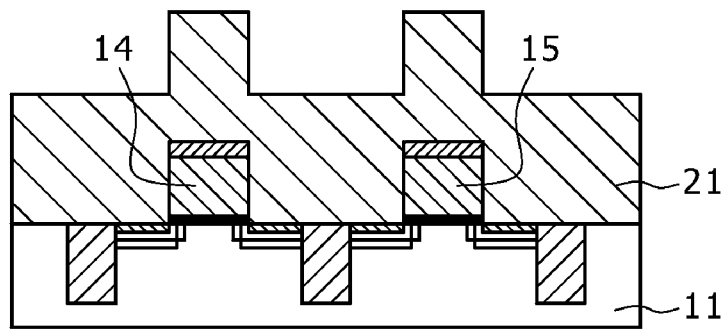

Next, as shown in FIG. 3E, an insulation film 21 is formed on the substrate 11, so as to be higher than the dummy gates 14, 15 and to cover the dummy gates 14, 15. As the insulation film 21, for example, silicon oxide is built up in a thickness of about 300 nm by use of a chemical vapor deposition (CVD) technique.

Figure 3F:
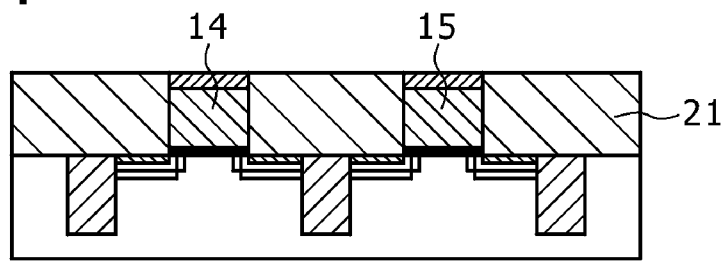

Subsequently, as shown in FIG. 3F, the surface of the insulation film 21 is flattened and the silicon nitride film at upper portions of the dummy gates 14 and 15 is exposed, by use of a CMP technique, for example.

Figure 3G:
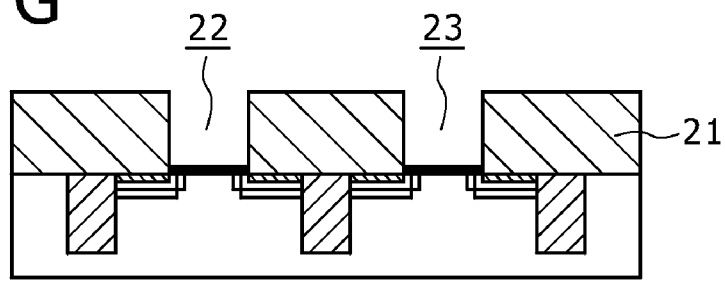

Next, as shown in FIG. 3G, the silicon nitride film is removed selectively. The removal is conducted by etching with phosphoric acid. Further, the polysilicon film in the dummy gates 14 and 15 [see FIG. 3F] is removed by use of a reactive ion etching (RIE) technique, for example. As a result, the first trench 22 and the second trench 23 are formed in the insulation film 21.

Figure 3H:
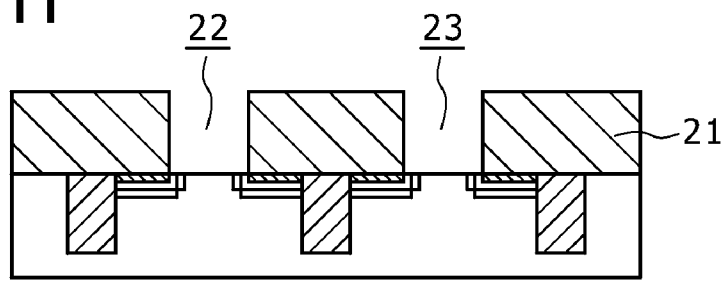

Subsequently, as shown in FIG. 3H, the gate insulation film 13 [see FIG. 3B] formed in bottom portions of the first trench 22 and the second trench 23 is removed. The removal is conducted by use of a fluoro etching species. As a result, the first trench 22 in which to form the gate of the p-type MOS transistor and the second trench 23 in which to form the gate of the n-type MOS transistor were formed in the insulation film 21.

Now, a second example of the embodiment of the semiconductor device in the present invention will be described below referring to a schematic configuration sectional diagram shown in FIG. 4.

Figure 4:
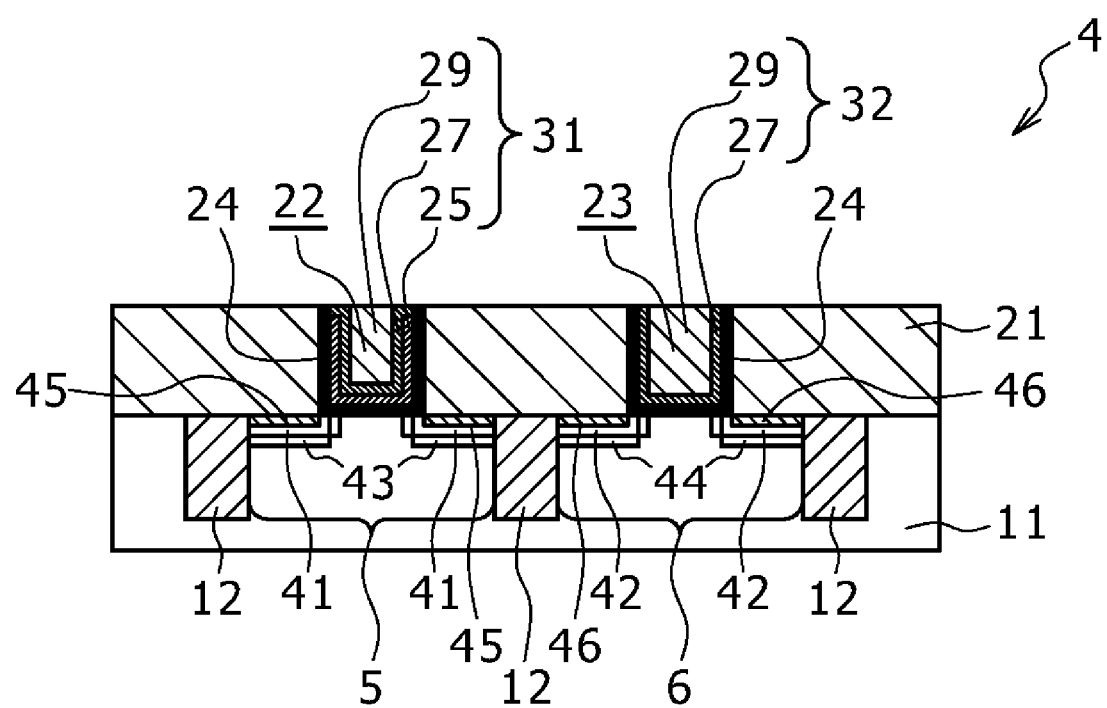
FIG. 4 is a schematic configuration sectional diagram showing a second example of an embodiment of the semiconductor device in the present invention.

As shown in FIG. 4, a first conduction type (p-type) MOS transistor 5 and a second conduction type (n-type) MOS transistor 6 of a conduction type opposite to the first conduction type are formed in a substrate 11, in the state of being isolated from each other by a device isolation region 12, to constitute a semiconductor device. An insulation film 21 formed on the substrate 11 is provided with a first trench 22, and a gate electrode 31 of the p-type MOS transistor 2 is formed in the first trench 22. In addition, the insulation film 21 is provided with a second trench 23, and a gate electrode 32 of the n-type MOS transistor 3 is formed in the second trench 23.

A first gate electrode material layer 25 of the first conduction type MOS transistor, a second gate electrode material layer 27 of the second conduction type MOS transistor, and an electrode metal layer 29 are formed in the first trench 22, with a gate insulation film 24 therebetween, to constitute the gate electrode 31. The first gate electrode material layer 25 is covered by the second gate electrode material layer 27 in the first trench 22.

The second gate electrode material layer 27 of the second conduction type MOS transistor, and the electrode metal layer 29 are formed in the second trench 23, with the gate insulation film 24 therebetween, to constitute the gate electrode 32.

The first gate electrode material layer 25 can be formed, for example, of tantalum (Ta), hafnium (Hf), titanium (Ti), tungsten (W), ruthenium (Ru) or an alloy of a plurality of metals selected from these metals. The second gate electrode material layer 27 is formed of a metallic material used as a gate electrode material in an n-type MOS transistor, and may be formed, for example, titanium (Ti), hafnium (Hf), tantalum (Ta), tungsten (W), ruthenium (Ru) or an alloy of these metals. The electrode metal layer 29 may be formed, for example, of tungsten (W), tantalum (Ta), titanium (Ti), or an alloy of these metals, or a laminate film composed of two or more metals selected from these metals.

In addition, extension regions 41 are formed in the substrate 11 on both sides of the gate electrode 31 in the p-type MOS transistor region. In addition, extension regions 42 are formed in the substrate 11 on both sides of the gate electrode 32 in the n-type MOS transistor region. Further, source/drain regions 43 deeper than the extension regions 41 are formed in the substrate 11 on both sides of the gate electrode 31 in the p-type MOS transistor region. Besides, the extension regions 41 are so formed as to extend to the gate electrode 31 side, relative to the source/drain regions 43. Further, source/drain regions 44 deeper than the extension regions 42 are formed in the substrate 11 on both sides of the gate electrode 32 in the n-type MOS transistor region. In addition, the extension regions 42 are so formed as to extend to the gate electrode 32 side, relative to the source/drain regions 44. Silicide films 45 and 46 are formed on the surfaces of the source/drain regions 43 and 44, to lower the resistances of the source/drain regions 43 and 44. As an example, the silicide films 45 and 46 are composed of cobalt silicide.

In the above-described semiconductor device 4, the first gate electrode material layer 25 is covered with the second gate electrode material layer 27 in the first trench 22 in which the gate electrode 31 of the p-type MOS transistor 2 is formed. Therefore, when polishing is conducted so as to leave the electrode metal layer 29 in the first trench 22 and the second trench 23, the layers exposed to the surface are the electrode metal layer 29, the second gate electrode material layer 27 and the gate insulation film 24. Since the number of the kinds of metallic layers exposed to the surface at the time of polishing is thus reduced as compared with that in the related art, galvanic corrosion is generated with difficulty in this structure. In addition, since the structure makes it possible to form the electrode metal layer 29 inside the first trench 22 and inside the second trench 23 by polishing of the electrode metal layer 29 and the second gate electrode material layer 27, polishing with high accuracy can be easily performed by use of an abrasive used in the related art.

Therefore, the semiconductor device 4 in the present invention is so configured that polishing can be performed while suppressing or preventing the galvanic corrosion, so that a gate structure with high reliability can be obtained, and enhanced transistor performance can be contrived.

Now, a second example of the embodiment of the method of manufacturing a semiconductor device in the present invention will be described below, referring to manufacturing step sectional diagrams shown in FIGS. 5A to 5C.

Figure 5A:
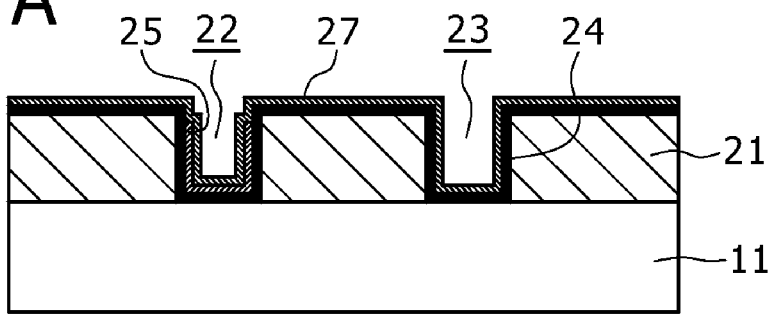
FIGS. 5A to 5C are manufacturing step sectional diagram showing a second example of an embodiment of the method of manufacturing a semiconductor device in the present invention.

As shown in FIG. 5A, the following processes are carried out, in the same manner as in the first example above. A first trench 22 in which to form a gate electrode of a first conduction type (hereinafter described to be p-type) MOS transistor is formed in an insulation film 21 formed on a substrate 11, and a second trench 23 in which to form a gate electrode of a second conduction type (hereinafter referred to as n-type) MOS transistor is formed in the insulation film 21. The first trench 22 and the second trench 23 are formed by ordinary lithography technique and etching technique (e.g., dry etching). In addition, the insulation film 21 is composed of a silicon oxide film, for example.

Next, a gate insulation film 24 is formed on the insulation film 21 inclusive of the inside surfaces of the first trench 22 and the inside surfaces of the second trench 23. The gate insulation film 24 can be formed, for example, of silicon oxide ($SiO_2$), silicon oxynitride (SiON), nitrogen-containing hafnium silicate (HfSiON), hafnium oxide ($HfO_2$), aluminum oxide ($Al_2O_3$) or the like; here, as an example, the gate insulation film 24 is composed of a silicon oxynitride film having a thickness of 2 nm.

Subsequently, a first gate electrode material layer 25 of the first conduction type MOS transistor is formed on the inside surfaces of the first trench 22, with the gate insulation film 24 therebetween. In this case, the first gate electrode material layer 25 is formed on the interior side relative to an opening portion of the first trench 22. The first gate electrode material layer 25 can be formed, for example, tantalum (Ta), hafnium (Hf), titanium (Ti), tungsten (W), ruthenium (Ru) or an alloy of a plurality of metals selected from these metals. Here, as an example, the first gate electrode material layer 25 is composed of a ruthenium (Ru) film having a thickness of 10 to 40 nm.

Next, a second gate electrode material layer 27 is formed in the first trench 22, with the gate insulation film 24 and the first gate electrode material layer 25 therebetween, and in the second trench 23, with the gate insulation film 24 therebetween. The second gate electrode material layer 27 can be formed of a metallic material used as a gate electrode material in an n-type MOS transistor, for example, titanium (Ti), hafnium (Hf), tantalum (Ta), tungsten (W), ruthenium (Ru) or an alloy of these metals. Here, as an example, hafnium is used, and the thickness thereof was set to be 10 to 40 nm. As a result, in the first trench 22, the first gate electrode material layer 25 is covered with at least the second electrode material layer 27.

Figure 5B:
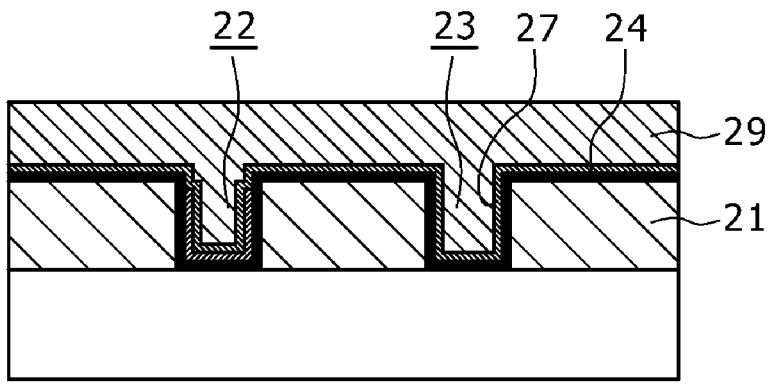

Subsequently, as shown in FIG. 5B, an electrode metal layer 29 is formed on the insulation film 21, with the gate insulation film 24 and the second gate electrode material layer 27 and the like therebetween, in such a manner as to fill up the inside of the first trench 22 and the second trench 23. The electrode metal layer 29 can be formed, for example, of tungsten (W), tantalum (Ta), titanium (Ti), or an alloy of these metals, or a laminate film composed of two or more metallic materials selected from these metallic materials. Here, as an example, tungsten (W) was used.

Figure 5C:
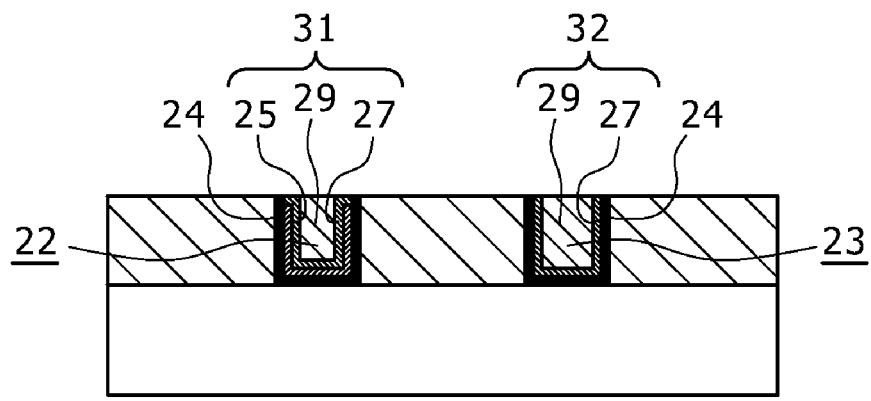
Figure 6A:
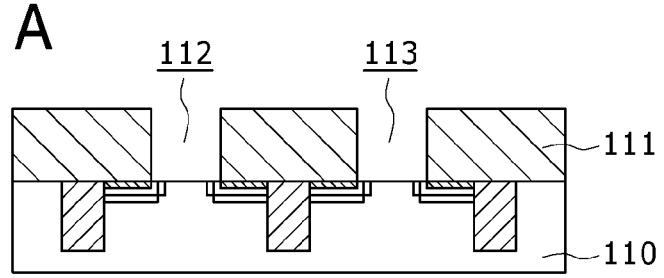
FIGS. 6A to 6I are manufacturing step sectional diagrams showing an example of a method of manufacturing a semiconductor device in the related art.
Figure 6B:
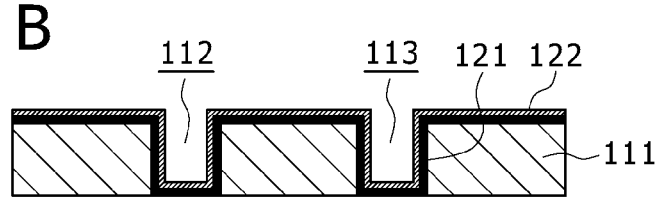
Figure 6C:
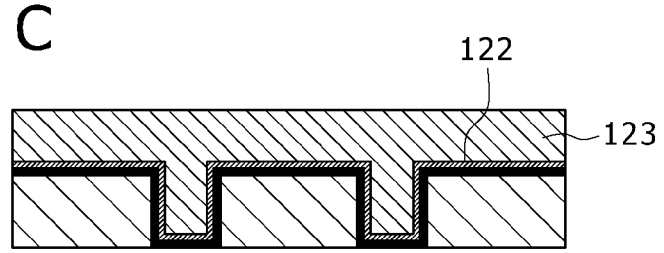
Figure 6D:
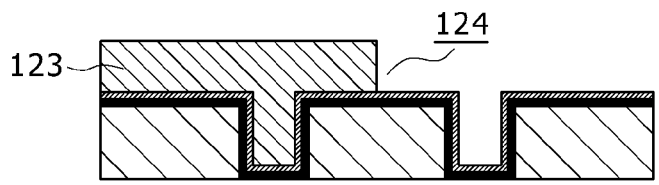
Figure 6E:
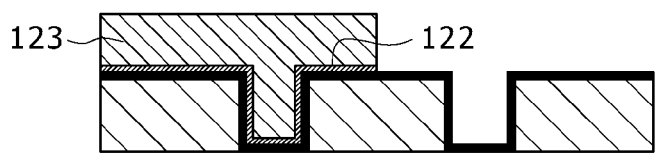
Figure 6F:
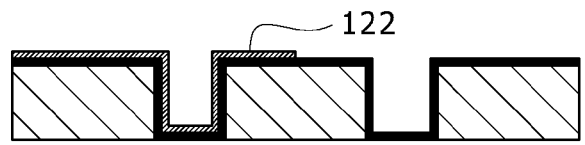
Figure 6G:
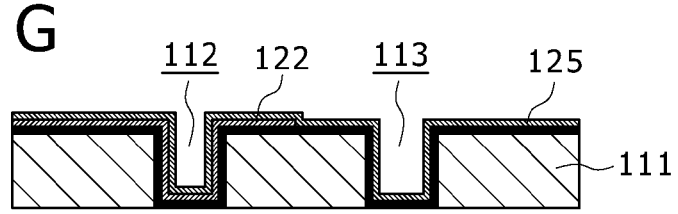
Figure 6H:
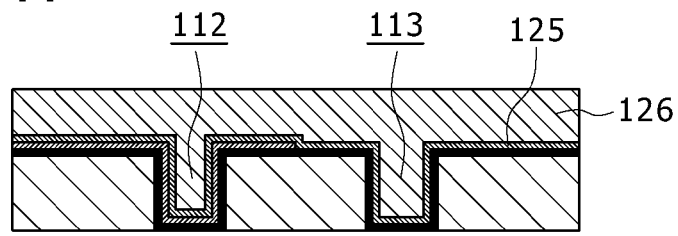
Figure 6I:
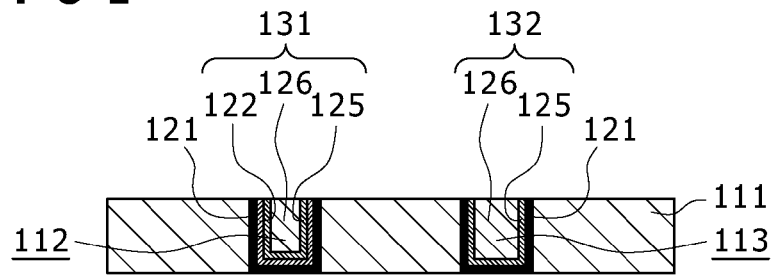

Next, as shown in FIG. 5C, the electrode metal layer 29 is polished away by a polishing technique (e.g., CMP), to leave the electrode metal layer 29 only inside the first trench 22 and the second trench 23. In this manner, the gate electrode 31 of the p-type MOS transistor composed of the first gate electrode material layer 25, the second gate electrode material layer 27, and the electrode metal layer 29 is formed inside the first trench 22, with the gate insulation film 24 therebetween, and the gate electrode 32 of the n-type MOS transistor composed of the second gate electrode material layer 27 and the electrode metal layer 29 is formed inside the second trench 23, with the gate insulation film 24 therebetween.

In the above-described method of manufacturing a semiconductor device, the first gate electrode material layer 25 is covered by the second gate electrode material layer 27 in the first trench 22 in which the gate of the first conduction type (p-type) MOS transistor is formed. Therefore, when polishing is so conducted as to leave the electrode metal layer 29 in the first trench 22 and the second trench 23, the layers exposed to the surface are the electrode metal layer 29, the second gate electrode material layer 27 and the gate insulation film 24. Accordingly, galvanic corrosion is less liable to occur, as compared with the case of the related art. In addition, since the electrode metal layer 29 and the second gate electrode material layer 27 can be formed inside the first trench 22 and inside the second trench 23 by polishing the electrode metal layer 29 and the second gate electrode material layer 27, polishing with high accuracy can be easily realized while using an abrasive used in the related art. Besides, by selecting the second gate electrode material layer 27 and the electrode metal layer 29 so as to reduce the potential differences among the metallic layers exposed at the time polishing, it is possible to securely suppress or prevent galvanic corrosion.

Thus, it is possible to perform polishing while suppressing or preventing galvanic corrosion, and to obtain a gate structure high in reliability. Therefore, it is possible to enhance the yield, and to contrive enhanced transistor performance.

The present invention is not limited to the details of the above-described preferred embodiments. The scope of the invention is defined by the appended claims and all changes and modifications as fall within the equivalence of the scope of the claims are therefore to be embraced by the invention.

What is claimed is:

1. A semiconductor device comprising:
   a substrate;
   an insulation film on said substrate;
   on said substrate, a first conduction type MOS transistor having a gate electrode provided in a first trench formed in said insulation film on said substrate, and
   on said substrate, a second conduction type MOS transistor having a gate electrode provided in a second trench formed in said insulation film, said first conduction type and said second conduction type being opposite types,
   wherein,
      said first trench is lined first and fully with a gate insulation film, second with a first gate electrode material layer of said first conduction type MOS transistor, and third with a second gate electrode material layer of said second conduction type MOS transistor,
      said first gate electrode material layer and said second gate electrode material layer extend along at least a same part of a sidewall of said first trench,
      remaining space in said first trench is filled with an electrode metal layer,
      said first gate electrode material layer and said second gate electrode material layer are covered by said electrode metal layer in said first trench,
      said second trench is lined first and fully with the gate insulation film and second with said second gate electrode material layer of said second conduction type MOS transistor,
      remaining space in said second trench is filled with said electrode metal layer,
      said second gate electrode material layer is covered by said electrode metal layer in said second trench, and
      an upper surface of said device is a planarized surface that includes said first conduction type MOS transistor and said second conduction type MOS transistor, said first gate electrode material layer not being exposed at the planarized surface.

2. A semiconductor device comprising:
   a substrate;
   an insulation film on said substrate;
   on said substrate, a first conduction type MOS transistor having a gate electrode provided in a first trench formed in said insulation film on said substrate, and
   on said substrate, a second conduction type MOS transistor having a gate electrode provided in a second trench formed in said insulation film, said first conduction type and said second conduction type being opposite types, wherein,
said first trench is lined first and fully with a gate insulation film, second with a first gate electrode material layer of said first conduction type MOS transistor, and third with a second gate electrode material layer of said second conduction type MOS transistor,
said first gate electrode material layer and said second gate electrode material layer extend along at least a same part of a sidewall of said first trench,
remaining space in said first trench is filled with an electrode metal layer,
at least said first gate electrode material layer is covered by said second gate electrode material layer in said first trench,
said second trench is lined first and fully with the gate insulation film and second with the second gate electrode material layer of said second conduction type MOS transistor,
remaining space in said second trench is filled with the electrode metal layer,
said second gate electrode material layer is covered by said electrode metal layer in said second trench, and
an upper surface of said device is a planarized surface that includes said first conduction type MOS transistor and said second conduction type MOS transistor, said first gate electrode material layer not being exposed at the planarized surface.

\* \* \* \* \*